United States Patent [19]

Pennaz

[11] Patent Number: 5,354,367

[45] Date of Patent: * Oct. 11, 1994

[54] RADIATION CURABLE INK COMPOSITION AND METHOD OF MAKING AND USING SUCH COMPOSITION

[75] Inventor: Thomas J. Pennaz, Brooklyn Park, Minn.

[73] Assignee: Deluxe Corporation, St. Paul, Minn.

[*] Notice: The portion of the term of this patent subsequent to Aug. 16, 2011 has been disclaimed.

[21] Appl. No.: 92,741

[22] Filed: Jul. 14, 1993

Related U.S. Application Data

[63] Continuation-in-part of Ser. No. 946,762, Sep. 17, 1992, abandoned.

[51] Int. Cl.$^5$ ................. C09D 11/08; C09D 11/10
[52] U.S. Cl. ................ 106/20 R; 106/27 R; 106/29 R; 106/30 R; 523/160; 101/45
[58] Field of Search .............. 106/20 R, 30 R, 27 R, 106/29 R; 523/160; 101/45

[56] References Cited

U.S. PATENT DOCUMENTS

| | | | |
|---|---|---|---|
| Re. 25,164 | 5/1962 | Cline | 427/513 |
| 2,236,397 | 3/1941 | Drummond | 427/257 |
| 3,013,895 | 12/1961 | Agruss | 427/511 |
| 3,041,203 | 6/1962 | Sites et al. | 106/28 R |
| 3,050,413 | 8/1962 | Sites et al. | 106/28 R |
| 3,051,591 | 8/1962 | Sites et al. | 106/28 R |
| 3,052,568 | 9/1962 | Sites et al. | 106/28 R |
| 3,434,987 | 3/1969 | Dhein et al. | 106/252 |
| 3,471,415 | 10/1969 | Friedman et al. | 524/145 |
| 3,533,811 | 10/1970 | Clements et al. | 106/24 B |
| 3,713,864 | 1/1973 | Ackerman et al. | 427/511 |
| 3,772,171 | 11/1973 | Savageau et al. | 427/511 |
| 3,781,214 | 12/1973 | Nemoto et al. | 106/20 R |
| 3,803,109 | 4/1974 | Nemoto et al. | 106/20 R |
| 3,842,051 | 10/1974 | Himics | 106/20 R |
| 3,845,056 | 10/1974 | Robson et al. | 106/20 R |
| 3,847,770 | 11/1974 | Radlowe et al. | 106/20 R |
| 3,856,744 | 12/1974 | Radlove et al. | 106/20 R |
| 4,026,939 | 5/1977 | Weiss et al. | 106/20 R |
| 4,045,416 | 8/1977 | Robson et al. | 106/20 R |
| 4,050,412 | 9/1977 | Bautz | 427/511 |
| 4,125,678 | 11/1978 | Stvan et al. | 427/511 |
| 4,137,138 | 1/1979 | Batt et al. | 106/20 R |
| 4,163,001 | 7/1979 | Carumpalos et al. | 106/20 R |
| 4,204,010 | 5/1980 | Kramm et al. | 427/511 |
| 4,231,742 | 11/1980 | Clausen et al. | 106/22 R |
| 4,233,754 | 11/1980 | Dubuit | 427/541 |
| 4,251,341 | 2/1981 | Felder et al. | 106/20 R |
| 4,271,258 | 6/1981 | Watariguchi | 106/20 R |
| 4,280,888 | 7/1981 | Bush et al. | 427/511 |
| 4,303,924 | 12/1981 | Young, Jr. | 106/22 R |
| 4,390,565 | 6/1983 | Fonda | 427/511 |
| 4,401,686 | 8/1983 | Durand | 427/511 |
| 4,556,427 | 12/1985 | Lewis | 106/20 R |
| 4,579,888 | 4/1986 | Kodama et al. | 106/20 R |
| 4,648,905 | 3/1987 | Peck et al. | 106/27 R |
| 4,659,380 | 4/1987 | Winters et al. | 106/14.14 |
| 4,664,710 | 5/1987 | Gleason et al. | 106/23 D |
| 4,680,368 | 7/1987 | Nakamoto et al. | 106/20 R |

(List continued on next page.)

OTHER PUBLICATIONS

The Printing Ink Manual, Fourth Edition (1988) edited by R. H. Leach and published by Van Nostrand Reinhold (No month).

*Primary Examiner*—Helene Klemanski
*Attorney, Agent, or Firm*—Dorsey & Whitney

[57] ABSTRACT

A vehicle for a radiation curable ink composition and methods of making and using such vehicle and ink composition. The vehicle and ink composition are substantially water insoluble and include a water reducible resin which is present in the vehicle and ink composition is its water insoluble form and which is present in an amount sufficient to render the vehicle and ink composition water washable using an alkaline wash.

20 Claims, No Drawings

U.S. PATENT DOCUMENTS

| | | | |
|---|---|---|---|
| 4,699,660 | 10/1987 | Frank et al. | 106/20 R |
| 4,747,882 | 5/1988 | Schwartz et al. | 106/23 R |
| 4,764,215 | 8/1988 | Rudolph | 106/27 R |
| 4,765,243 | 8/1988 | Schiefer et al. | 106/20 R |
| 4,783,220 | 11/1988 | Gamble et al. | 106/27 R |
| 4,789,399 | 12/1988 | Williams et al. | 106/20 R |
| 4,853,421 | 8/1989 | Hayes | 523/223 |
| 4,886,553 | 12/1989 | Gillich | 134/42 |
| 4,886,844 | 12/1989 | Hayes | 523/223 |
| 4,960,614 | 10/1990 | Durand | 427/511 |
| 4,966,628 | 10/1990 | Amon et al. | 106/20 R |
| 5,009,716 | 4/1991 | Gerson | 134/40 |
| 5,015,711 | 5/1991 | Simonet et al. | 526/301 |
| 5,030,683 | 7/1991 | Nakamura | 524/512 |
| 5,034,244 | 7/1991 | Berrer et al. | 427/511 |
| 5,059,266 | 10/1991 | Yamane et al. | 427/511 |
| 5,077,348 | 12/1991 | Nakamura et al. | 524/512 |
| 5,085,697 | 2/1992 | Kimura et al. | 106/20 R |
| 5,087,659 | 2/1992 | Fujisawa | 524/594 |
| 5,093,038 | 3/1993 | Durand | 252/514 |
| 5,098,478 | 3/1992 | Krishnan et al. | 106/20 R |
| 5,100,934 | 3/1992 | Glesias | 106/20 R |
| 5,102,856 | 4/1992 | Doll et al. | 523/161 |
| 5,104,449 | 4/1992 | Pavlin | 106/30 R |
| 5,104,567 | 4/1992 | Staehr | 252/174.17 |
| 5,106,416 | 4/1992 | Moffatt et al. | 106/20 D |
| 5,109,054 | 4/1992 | Smith | 524/514 |
| 5,114,478 | 5/1992 | Auslander et al. | 106/30 R |
| 5,116,409 | 5/1992 | Moffatt | 106/20 R |
| 5,118,583 | 6/1992 | Kondo et al. | 430/309 |
| 5,139,817 | 8/1992 | Abe et al. | |
| 5,234,577 | 8/1993 | Van Slyke | 208/13 |

RADIATION CURABLE INK COMPOSITION AND METHOD OF MAKING AND USING SUCH COMPOSITION

This is a continuation-in-part of application Ser. No. 07/946,762 filed Sep. 17, 1992, now abandoned.

BACKGROUND OF THE INVENTION

1. Field of the Invention

The present invention relates generally to the field of radiation curable ink compositions, and more particularly to radiation curable ink compositions and vehicles therefor which contain water insoluble components and which can be printed in a substantially water insoluble form, but which can be cleaned up using aqueous solutions. The ink compositions of the present invention are substantially water insoluble when printed and water soluble or washable at certain selected alkaline pH levels when clean up is desired. The present invention also relates to a method of making and using such compositions.

2. Summary of the Prior Art

A wide variety of radiation curable inks currently exist in the art. In general, radiation curable inks and ink compositions dry or cure via free radical polymerization. The two most common radiation curing methods involve ultraviolet (UV) curing and electron beam (EB) curing, although other forms of radiation such as that derived from infra red and microwave energies are also commonly included in the category of radiation drying or curing and are thus included for purposes of defining the present invention.

A principal advantage of radiation curing involves the reduction of volatile organic compounds (VOCs) which have become the focus of many state and federal regulations. Many conventional inks dry by evaporation or other processes which involve the use of solvents and the evaporation of solvents during the drying or curing process. This necessarily results in the introduction of such solvents or VOCs into the atmosphere or creates disposal problems with respect to such solvents. The free radical polymerization of inks via UV or EB curing substantially reduces if not eliminates solvent emission concerns during the drying or curing process. A further advantage of radiation curable ink systems is that the inks are dried or cured only upon exposure to a particular actinic radiation or other free radical source. Thus, the premature drying of radiation curable inks in the ink containers or on printing plates and other application equipment can be avoided.

However, despite the recognized advantages of radiation curable inks over ink compositions which dry by solvent evaporation, certain limitations continue to exist. For example, although radiation curable inks can be formulated with little if any solvent component, the components of conventional radiation curable ink compositions are not water soluble to the extent that they can be washed or cleaned up with aqueous solutions. Thus, the cleanup of radiation curable inks from printing plates, rollers, brushes, blankets and other application equipment necessarily involves the use of nonaqueous, organic or other solvents which are capable of dissolving or washing, and thus cleaning up, the various resins and other components of the ink composition. In many cases, these solvents are volatile organic compounds or glycol ethers or esters. Some of these are considered as hazardous wastes, thereby creating obvious safety concerns and disposal problems. Others, even though not technically considered as hazardous wastes, still pose serious health and safety concerns. Various attempts have been made to overcome this problem by formulating water soluble radiation curable inks which are substantially water soluble and can thus be cleaned up with aqueous solutions. However, such water based or water soluble inks generally exhibit properties inferior to certain desired properties of water insoluble inks.

Accordingly, there is a need in the art for a radiation curable ink composition, and methods associated therewith, which has all of the advantageous characteristics of a water insoluble ink, including high resistance to water and alkali environments, but which can be washed and cleaned up using aqueous solutions.

SUMMARY OF THE INVENTION

In contrast to the prior art, the present invention relates generally to a radiation curable ink or ink composition which is water insoluble or substantially water insoluble in its printable form, but which can be washed and cleaned up with an aqueous or aqueous based solution. The ink composition of the present invention overcomes many of the ink quality and durability problems of conventional water soluble or dispersable radiation curable inks, while still retaining the advantages of being washed or cleaned up with aqueous solutions.

More specifically, the composition of the present invention comprises conventional radiation curable ink components such as oligomers or prepolymers, monomers, initiators (when needed) and various pigments and other additives and inhibitors (when desired). In addition, the ink composition of the present invention includes a water reducible resin component which is compatible with the oligomers, monomers and other components of the ink composition and which exhibits selective water solubility behavior as a function of pH. In the preferred ink composition, the water reducible resin component is unneutralized or substantially unneutralized both when combined with the other ink components to form the ink composition as well as when the ink composition is printed. This results in an ink composition which is water insoluble or substantially water insoluble but which can be washed or cleaned up with an aqueous alkaline solution.

The radiation curable ink composition vehicle and methods of the present invention can be used in connection with virtually any printing system including lithography, letter-press, gravure, flexographic, intaglio and the like.

Accordingly it is an object of the present invention to provide an improved radiation curable ink composition which is washable and capable of being cleaned up in an aqueous or an alkaline solution.

Another object to the present invention is to provide a radiation curable ink composition and vehicle therefor which is water insoluble or substantially water insoluble in its printable form, but which can be washed and cleaned up with an aqueous solution.

A still further object of the present invention is to provide a radiation curable ink which can be cleaned up with an aqueous solution, but which exhibits increased resistance to water.

Another object of the present invention is to provide a method of making and using the above radiation curable ink composition.

These and other objects of the present invention will become apparent with reference to the description of the preferred embodiment and method and the appended claims.

DESCRIPTION OF THE PREFERRED COMPOSITION AND METHOD

The present invention relates to a radiation curable ink composition and to various methods related to the making and using of such a composition. Although the composition and method of the present invention can be used with virtually any printing process, the preferred composition and method are described with respect to a radiation curable lithographic ink and a lithographic printing process. Specific examples are described with respect to both a lithographic process as well as a non-lithographic or letterpress process.

Conventional radiation curable ink compositions include oligomers and monomers, one or both of which are commonly referred to as pre-polymers. Most such compositions also include initiators (when needed) and various pigment, additives and inhibitors to provide the ink composition with the desired color and other physical and functional characteristics. Commonly, the oligomers and monomers are referred to as the ink vehicle and function to carry and disperse the pigment and to form the film on the substrate, when printed. In addition to these common components, the ink composition of the present invention also includes a water reducible resin component which is compatible with the oligomers, monomers and other components of the ink system and which exhibits selective water solubility behavior as a function of pH. Further, in accordance with the preferred embodiment, the water reducible resin exists in the ink composition in its unneutralized or substantially unneutralized form so that the ink composition in its printable form is water insoluble or substantially water insoluble.

The various oligomers, monomers, initiators and other additives which are common in conventional radiation curable inks are also usable in the ink compositions defined by the present invention. Specifically, the oligomers common to radiation curable inks and to the composition of the present invention may be any of the acrylate, polyester, urethane or other systems such as thiol/nen, epoxy or vinyl ether systems. The oligomers are normally highly viscous and function as a binder in the ink vehicle or varnish and thus the ink composition. The preferred oligomers in accordance with the present invention, however, are acrylate formulations. Examples include the acrylate esters and specifically epoxy acrylates, polyester acrylates, unsaturated polyesters and urethane acrylates. Such components are well known in the art and are available from a variety of sources. Specific reference in this regard is made to The Printing Ink Manual, Fourth Edition (1988) edited by R. H. Leach and published by Van Nostrand Reinhold, the substance of which is incorporated here in reference.

The monomer component of the vehicle and ink composition of the present invention is also similar to those conventionally used in the formulation of radiation curable inks. The selection of the appropriate monomer for an ink system is governed by various functional aspects of the monomer including its viscosity, cure rate with the oligomer, tack as well as various health and safety aspects. The monomers are usually low viscous liquids which assist in defining the viscosity of the ink composition in combination with the relatively viscous oligomers.

Common monomers for conventional radiation curable inks as well as the compositions of the present invention include tripropylene glycol diacrylate (TPGDA), n-vinyl pyrollidone and Dianol diacrylate and its analogs. The above monomers have been used extensively in environments where health and safety concerns exist. In those areas where health and safety are not as important, 1, 6-hexanediol diacrylate (HDDA) is one of the most common monomers available. Trimethylol propane triacrylate (TMPTA) has also been used extensively in lithographic applications and exhibits high reactivity and reasonable viscosity. Other monomers usable in radiation curable inks are known in the art and are available from a variety of sources, including The Printing Ink Manual, supra.

Because the oligomers and the monomers of a radiation curable ink or varnish substantially define the physical properties of the ink composition, both prior and subsequent to printing, selection of the appropriate oligomer and monomer should be made with this in mind. In this regard, properties such as viscosity, tack, cure rate, adhesion, gloss, and durability are controlled principally by the selection of these components. These components will also vary to some extent depending upon the printing process for which the ink composition is to be used and the particular physical properties which are desirable for such process. The selection of these components for particular printing applications are known in the art.

Radiation curable inks and in particular radiation curable inks of the present invention also require a mechanism for initiating the free radical polymerization of the pre-polymers. This mechanism in turn depends upon the system which will be used to cure the ink composition. If ultraviolet (UV) radiation is used to initiate the free radical polymerization, a photoinitiator is required in the ink composition. If electron beam (EB) curing is utilized, photoinitiators are not needed.

Since EB curing does not require photoinitiators, EB curing is commonly preferred since it substantially eliminates unreacted residue. EB curing does, however, require substantial capital investment. In a UV curing system, the photoinitiators present in the ink composition are normally not totally incorporated into the cross-link network. Thus, they are generally present at significant levels in the cured film either in their original or other volatile form. This can be a source of concern depending upon the particular photoinitiator used, and in some cases dictates the need for EB curing rather than UV curing.

Energy sources usable in creating the free radicals and thus curing the ink compositions of the present invention are those which are well known and conventional in the art. For EB curing, this includes conventional electron beam equipment such as linear cathode types. UV generating equipment commonly includes UV lamps which function to provide radiation sufficient to activate the photoinitiators and generate the free radicals needed for polymerization. Examples of UV generating equipment include a UGVEX LCU 7500 laboratory UV curing system or a Prime UV model 120/34 manufactured by Prime Systems Inc. Microwave lamps can also be used to provide the activating radiation in certain circumstances.

During curing, the free radicals resulting from the EB or UV system react with the oligomer and monomer system to effect polymerization. The basic mechanism of photoinitiation and photo chemistry is well known in the art. Benzophenone is one of the most commonly used photoinitiators in a UV system. Such compound, however, requires a proton donor, such as an amine, in order to yield sufficient free radicals. Other photoinitiators known in the art operate without the need of a proton donor and simply undergo fragmentation into reactive species under UV light.

Pigments usable in the ink composition of the present invention may comprise a variety of pigments. Most of the pigments normally used in lithographic or other printing processes are suitable for use in radiation curable systems. Some pigments, because of their ability to absorb UV radiation, can reduce the cure rate. Thus, pigments usable for radiation curable ink compositions and in particular the compositions of the present invention should take this into account. However, pigments are known in the art which have been found to be suitable in radiation curable ink composition systems. Examples of applicable pigments are those set forth in The Printing Ink Manual, supra, and in the examples below.

The additives, inhibitors and other components in a conventional radiation curable system may also be used in formulating inks in accordance with the present invention. The available additives and inhibitors and their particular functions in a radiation curable system are well known in the art. Such components are considered to be optional, depending upon the properties desired in the ink formulation.

In addition to the conventional ink composition components described above, the radiation curable ink composition and vehicle of the present invention also includes a water reducible resin component which is compatible with the other ink components and which exhibits selective water solubility behavior as a function of pH. As used herein, the term water reducible defines a property of a resin or composition which enables such resin or composition to be substantially water insoluble under certain conditions (preferably pH related) and capable of being or becoming water soluble or water washable or dispersable under certain other conditions (preferably pH related). In accordance with the preferred embodiment, the term water reducible defines a resin or composition whose water solubility behavior is pH dependent, with such resin or composition being water insoluble under acidic conditions and water washable under alkaline conditions.

The acid number of a resin is one measure of that particular resin to exhibit water reducible properties (i.e.), the ability to be water insoluble at certain acidic pH levels and water soluble or washable at certain alkaline pH levels. The acid number at which a particular resin will exhibit water reducible behavior, however, varies from resin to resin. Some, such as certain alkyds, polyesters, polyolefins, epoxy esters, rosin derivatives and modified oils, will exhibit water reducible behavior at relatively low acid numbers in the range of 25 to 200. Others, including certain modified rosins, such as phenolics, maleics, fumaric and pentaerythritol esters, certain synthetic hydrocarbons as well as unmodified rosin and derivatives thereof, exhibit water reducible behavior only at relatively high acid numbers, greater than 200, if at all. Regardless of the particular type of resin, however, the acid number at which such resin exhibits water reducible behavior will depend on the particular formulation and structure of that resin.

For radiation curable ink compositions in accordance with the present invention, the acid number of the water reducible resin must be sufficiently high to provide such resin with water reducible characteristics. Preferably this is at least about 25 and more preferably about 30. Additionally, for radiation curable ink compositions usable in lithographic printing, the water reducible resin or at least the major portion of the water reducible resin, should preferably be one where water reducible behavior is achieved within an acid number range of less than about 200, more preferably less than about 150 and most preferably less than about 100. For ink compositions other than for a lithographic application, however, no upper limit for the acid number exists; however, the resin must have an acid number which causes it to exhibit water reducible behavior.

For the water reducible resin component to cause the entire ink composition to exhibit the desired characteristic of being substantially water insoluble during printing, but yet washable with an aqueous solution, such water reducible resin must be present in an amount effective to result in such behavior. Preferably the water reducible resin of the preferred embodiment should be present in an amount of at least about 5% and more preferably about 5-50% by weight of the ink composition vehicle or varnish (the oligomer, monomer and initiator, if any). Most preferably, the water reducible resin should be present in an amount of at least about 10% or about 10-30% by weight. The optimal amount will depend to some extent on the particular water reducible resin being utilized. Further, for lithographic applications it is preferable that at least 5% or about 5-65% by weight of the vehicle be comprised of a water reducible resin with an Acid Number less than 200, more preferably less than 150 and most preferably less than 100.

It is also contemplated that in accordance with the preferred embodiment, the water reducible resin component of the ink composition may comprise either a single water reducible resin or a blend of two or more such resins which exhibit the desired water solubility characteristics or behavior of being water insoluble at certain acidic pH levels and water washable under certain alkaline pH levels. Numerous water reducible resins currently exist or can be formulated to meet the requirements of the present invention. Many of these have been tested in a lithographic printing environment. Specifically, it has been shown that certain water reducible alkyds (Cargill's short oil alkyds 74-7450, 74-7451; Cargill's long oil alkyd 74-7416; Cook Composite's short oil alkyd 101210), certain water reducible polyesters (Cargill's polyester 72-7203), certain water reducible polyolefins (Cargill's modified polyolefin 73-7358), certain water reducible modified oils (Cargill's modified linseed oil 73-7319) and certain water reducible epoxy esters (Cook Composite's styrenated epoxy ester 100453) exhibit the desired characteristics and are acceptable providing they are compatible with the other components of the radiation curing system and are present in an amount sufficient to cause the vehicle and ink composition to exhibit similar water reducible characteristics. The most preferred resins are the water reducible alkyds and modified drying oils.

To provide an ink composition in accordance with the present invention which is substantially water insoluble and can be printed in that form, but which can be washed or cleaned up using an aqueous solution requires that the water reducible resin be combined with the other ink composition components and exist in the ink composition in its unneutralized or substantially unneutralized form. Thus, the water reducible resin component of the present ink composition must not be preneutralized as is the case in many prior art water based ink compositions, nor must the other ink composition components contain groups which will appreciably neutralize the water reducible resin component. By maintaining the water reducible resin in its unneutralized or substantially unneutralized form, the water reducible resin and the ink composition remains substantially water insoluble and can be printed in that form.

Following the printing process, addition of a source of hydroxy or other basic ions to the ink composition results in the water reducible resin, and thus the ink composition, being converted to a water soluble or at least a water washable or dispersable form. In accordance with the preferred embodiment of the present invention, this source of hydroxy or other basic ions is provided by an alkaline wash solution which is used to clean up or wash unused ink from the printing plates, brushes, rollers and other application equipment. The alkaline strength of such wash should be sufficient to render the water reducible resin, and thus the ink composition, water washable or dispersable under normal operating conditions.

In general, the more alkaline the wash solution, the quicker and more effective the ink composition will be removed or dispersed. A wash solution with a pH of between 8.5 and 14 and preferably between about 10.5 and 13 is effective to clean up blanket cylinders and rollers containing ink compositions from a lithographic process using a rag or towel dipped in the wash solution.

A wide range of alkaline cleaning agents or wash solutions can also be employed with the inks and ink compositions of the present invention. The principal property of such solutions is that they have a pH or source of hydroxy or other basic ions sufficient to convert the water reducible resin, and thus the ink composition, to a water soluble or washable form. The preferred wash solution contains sodium hydroxide as the hydroxy ion source; however, various other alkaline solutions can be used as well including, without limitation, solutions of the alkali metals, alkaline earth metals, ammonium, quaternary ammonium, etc. The use of surfactants, cosolvents and other additives common to the industry may also be used as a part of the wash solution. These tend to reduce the pH requirements of the wash solution or the amount of wash needed to obtain acceptable wash results. Selection of the appropriate surfactant will depend on the particular composition. An example of a surfactant which may be used is a nonionic surfactant made by Mazer Chemical and sold under the tradename Mazawet 77. Certain other nonionic, cationic, anionic and amphoteric surfactants or blends may be used as well.

Ink compositions in accordance with the present invention can be formulated for a variety of printing processes. The physical and other characteristics of such ink compositions will vary depending upon the particular process employed; however, all will embody the concept of the present invention which is to embody a substantially unneutralized water reducible resin component in an amount sufficient to provide an ink composition which exists and can be printed in a substantially water insoluble form, but which can be washed and cleaned up using an aqueous solution. The use of the ink composition of the present invention is described with respect to a lithographic printing process. For use in such a process, the water reducible resin component should preferably exhibit such water reducible characteristics at an acid number of about 25–150, more preferably about 30–100 and most preferably 40–60. Fountain solutions useful with the lithographic ink composition of the preferred embodiment include all commercially available acidic solutions. Preferably, such solutions should be chosen which have a working strength pH of less than 6.5, and more preferably less than 5.5. Additionally, certain fountain additives such as isopropyl alcohol, alcohol substitutes and antipiling additives can be used successfully with the compositions of the present invention.

The present invention also relates to various methods of making, using and printing the ink composition of the present invention. The method of making the ink composition includes the method step of combining conventional radiation curable ink components, including the oligomers and monomers, with an unneutralized water reducible resin as described above.

The method of using or printing includes applying the substantially water insoluble ink composition of the present invention to a printing plate or other print application equipment, transferring such ink composition to a desired print receiving substrate or medium and then cleaning up or washing the printing plate or other application equipment using an aqueous alkaline solution. The ink composition applied via the above method must include a water reducible resin in an amount sufficient to result in the entire ink composition being substantially water insoluble at acidic pH conditions and water washable or dispersable at alkaline pH conditions.

In the lithographic application, the method includes the steps of first applying a water insoluble lithographic ink composition and an aqueous, acidic fountain solution to a lithographic printing plate, transferring the ink composition from the printing plate to a receiving substrate via a lithographic printing process and then washing or cleaning the printing plate and other print components with an aqueous wash solution having a selected alkaline pH at which the ink composition is washable. Preferably the fountain solution has a pH less than 7.0, and more preferably less than 6.5 and most preferably less than about 5.5. The alkaline wash solution has a pH greater than 7.0, preferably greater than 8.5 and most preferably greater than about 10.5.

Having described the details of the preferred composition methods, the following examples will demonstrate radiation curable ink compositions employing various formulations within the scope of the present invention and the applicability of the compositions of the present invention to various printing processes and the like. Unless otherwise specified, all percentages are "by weight". In all examples, 100 grams of ink composition were prepared.

PROCEDURE OF EXAMPLES 1-4

In each of Examples 1–4, and in various other Examples, where indicated, an AB Dick 375 offset press was inked up and the ink film was measured using a Gardner Ink Film Thickness Gauge. The press was fitted with a conventional Dahlgren dampening system. The ink was printed on standard chrome coat 80# paper. Once printed, the stock was passed under a UVEXS LCU 7500 laboratory UV curing system. Print densities, when measured, were evaluated using an X-Rite 418 densitometer.

The press was run for 300 impressions and stopped every 100 impressions, at which time the blanket was cleaned using water adjusted to pH 13 using sodium hydroxide. At the conclusion of the press test, the rollers were cleaned using water adjusted to pH 13 using sodium hydroxide. Print quality and clean-up for each of Examples 1–4 were acceptable. Examples 1–4 were developed to demonstrate the applicability of ink compositions to process color in accordance with the present invention. The water reducible resin for Examples 1–4 was Cargill's Modified Linseed Oil 73-7319 with an Acid Number of 95–105.

EXAMPLE 1—PROCESS BLACK

| | |
|---|---|
| Ebecure 657 (Radcure Industries) | 45% |
| Modified Linseed Oil 73-7319 (Cargill, Inc.) | 20% |
| Monomer OTA-480 (Radcure Industries) | 15% |
| Igracure 651 (Ciba-Geigy) | 2.5% |
| Igracure 184 (Ciba-Geigy) | 2.5% |
| Regal 400R (Cabot, Inc.) | 15% |

Ink Film: .5 mil
Print Density: 1.6

EXAMPLE 2: PROCESS CYAN

| | |
|---|---|
| Ebecure 657 (Radcure Industries) | 45% |
| Modified Linseed Oil 73-7319 (Cargill, Inc.) | 20% |
| Monomer OTA-480 (Radcure) | 15% |
| Igracure 651 (Ciba-Geigy) | 2.5% |
| Igracure 184 (Ciba-Geigy) | 2.5% |
| Pigment FG 7030 (Toyo Ink) | 15% |

Ink Film: .4 mil
Print Density: 1.40

EXAMPLE 3—PROCESS MAGENTA

| | |
|---|---|
| Ebecure 657 (Radcure Industries) | 45% |
| Modified Linseed Oil 73-7319 (Cargill, Inc.) | 20% |
| Monomer OTA-480 (Radcure) | 15% |
| Igracure 651 (Ciba-Geigy) | 2.5% |
| Igracure 184 (Ciba-Geigy) | 2.5% |
| Pigment RD 2001 (Uhlich Color) | 15% |

Ink Film: .4 mil
Print Density: 1.31

EXAMPLE 4—PROCESS YELLOW

| | |
|---|---|
| Ebecure 657 (Radcure Industries) | 45% |
| Modified Linseed Oil 73-7319 (Cargill, Inc.) | 20% |
| Monomer OTA-480 (Radcure Industries) | 15% |
| Igracure 651 (Ciba-Geigy) | 2.5% |
| Igracure 184 (Ciba-Geigy) | 2.5% |
| Pigment YE 0150 (Uhlich Color) | 15% |

Ink Film: .45 mil
Print Density: 1.09

Examples 5–7 demonstrate the applicability of ink compositions in accordance with the present invention to a variety of monomers. The standard procedure was used from Examples 1–4. Acceptable print quality and clean up were exhibited for each example.

EXAMPLE 5

| | |
|---|---|
| Ebecryl 657 (Radcure Industries) | 45% |
| Modified Linseed Oil 73-7319 (Cargill, Inc.) | 20% |
| TMPTA (Radcure Industries) | 15% |
| Igracure 651 (Ciba-Geigy) | 2.5% |
| Igracure 184 (Ciba-Geigy) | 2.5% |
| Regal 400R (Cabot, Inc.) | 15% |

EXAMPLE 6

| | |
|---|---|
| Ebecryl 657 (Radcure Industries) | 45% |
| Modified Linseed Oil 73-7319 (Cargill, Inc.) | 20% |
| Lauryl Methacrylate (Sartomer) | 15% |
| Igracure 651 (Ciba-Geigy) | 2.5% |
| Igracure 184 (Ciba-Geigy) | 2.5% |
| Regal 400R (Cabot, Inc.) | 15% |

EXAMPLE 7

| | |
|---|---|
| Ebecryl 657 (Radcure Industries) | 45% |
| Modified Linseed Oil 73-7319 (Cargill, Inc.) | 20% |
| Isooctyl Acrylate (Sartomer) | 15% |
| Igracure 651 (Ciba-Geigy) | 2.5% |
| Igracure 184 (Ciba-Geigy) | 2.5% |
| Regal 400R (Cabot, Inc.) | 15% |

Example 8–9 demonstrate the applicability of ink compositions in accordance with the present invention to a variety of oligomers. The standard procedure of Examples 1–4 was followed. Acceptable print quality and dean up were exhibited for each of Examples 8–9.

EXAMPLE 8—URETHANE OLIGOMER

| | |
|---|---|
| Resin 15-1514 (Cargill, Inc.) | 45% |
| Modified Linseed Oil 73-7319 (Cargill, Inc.) | 20% |
| OTA-480 (Radcure Industries) | 15% |
| Igracure 651 (Ciba-Geigy) | 2.5% |
| Igracure 184 (Ciba-Geigy) | 2.5% |
| Carbon Black-Regal 400R (Cabot, Inc.) | 15% |

EXAMPLE 9—EPOXY OLIGOMER

| | |
|---|---|
| Ebecryl 1608 (Radcure Industries) | 45% |
| Modified Linseed Oil 73-7319 (Cargill, Inc.) | 20% |
| OTA-480 (Radcure Industries) | 15% |
| Igracure 651 (Ciba-Geigy) | 2.5% |
| Igracure 184 (Ciba-Geigy) | 2.5% |
| Carbon Black-Regal 400R (Cabot, Inc.) | 15% |

Examples 10–13 demonstrate the applicability of ink compositions in accordance with the present invention to a variety of water reducible resins suitable for use in the present invention. The standard procedure of Examples 1–4 was followed. Acceptable print quality and clean up were exhibited for each of Examples 10–13.

EXAMPLE 10—SHORT OIL ALKYD

| | |
|---|---|
| Ebecryl 657 (Radcure Industries) | 45% |
| Alkyd 74-7451 (Cargill, Inc.) AN 47–53 | 20% |
| OTA-480 (Radcure Industries) | 15% |
| Igracure 651 (Ciba-Geigy) | 2.5% |
| Igracure 184 (Ciba-Geigy) | 2.5% |
| Carbon Black-Regal 400R (Cabot, Inc.) | 15% |

EXAMPLE 11—MODIFIED POLYOLEFIN

| | |
|---|---|
| Ebecryl 657 (Radcure Industries) | 45% |

| Polyolefin 73-7358 (Cargill, Inc.) AN 25–30 | 20% |
|---|---|
| OTA-480 (Radcure Industries) | 15% |
| Igracure 651 (Ciba-Geigy) | 2.5% |
| Igracure 184 (Ciba-Geigy) | 2.5% |
| Carbon Black-Regal 400R (Cabot, Inc.) | 15% |

EXAMPLE 12—SHORT OIL ALKYD

| Ebecryl 657 Oligomer (Radcure Industries) | 50.0% |
|---|---|
| 74-7451 Short Oil Alkyd (Cargill, Inc.) AN 47–53 | 13% |
| OTA-480 Monomer (Radcure Industries) | 12% |
| Igracure 651 (Ciba-Geigy) | 2.5% |
| Igracure 184 (Ciba-Geigy) | 2.5% |
| Carbon Black-Regal 400R (Cabot, Inc.) | 20% |

EXAMPLE 13—SHORT OIL ALKYD

| Ebecryl 657 Oligomer (Radcure Industries) | 40% |
|---|---|
| 74-7416 Alkyd (Cargill, Inc.) AN 53–58 | 20% |
| TMPTA Monomer (Radcure Industries) | 15% |
| Durocure 1173 (Ciba-Geigy) | 2.5% |
| Igracure 184 (Ciba-Geigy) | 2.5% |
| Carbon Black-Regal 400R (Cabot, Inc.) | 20% |

Examples 14–15 demonstrate higher and lower levels of the water reducible resin. The standard procedure of Examples 1–4 was followed. Acceptable print quality and clean up were exhibited for each of Examples 14–15.

EXAMPLE 14—LOW LEVEL

| Ebecryl 657 (Radcure Industries) | 45% |
|---|---|
| Modified Linseed Oil 73-7319 (Cargill, Inc.) | 5% |
| OTA-480 (Radcure Industries) | 15% |
| Igracure 184 (Ciba-Geigy) | 2.5% |
| Igracure 651 (Ciba-Geigy) | 2.5% |
| Carbon Black-Regal 400R (Cabot, Inc.) | 15% |

EXAMPLE 15—HIGH LEVEL

| Ebecryl 657 (Radcure Industries) | 45% |
|---|---|
| Modified Linseed Oil 73-7319 (Cargill, Inc.) | 40% |
| OTA-480 (Radcure Industries) | 15% |
| Igracure 184 (Ciba-Geigy) | 2.5% |
| Igracure 651 (Ciba-Geigy) | 2.5% |
| Carbon Black-Regal 400R (Cabot, Inc.) | 15% |

Examples 16–19 demonstrate the use of various initiators for use with ink compositions containing a water reducible resin. Additionally, the following examples demonstrate the applicability to UV cured gloss overprint varnishes. The varnishes were tested by blade coating samples using a doctor blade, which were then cured through the lab UV unit. Acceptable print quality and clean up were exhibited for each of Examples 16–19. Further, hard, glossy films were obtained in all cases. No inhibition of cure rate was observed when compared to identical systems without the water reducible resin.

EXAMPLE 16

| Ebecryl 657 (Radcure Industries) | 60% |
|---|---|
| OTA-480 (Radcure Industries) | 15% |
| Igracure 369 (Ciba-Geigy) | 5% |
| Modified Linseed Oil 73-7319 (Cargill, Inc.) | 20% |

EXAMPLE 17

| Ebecryl 657 (Radcure Industries) | 60% |
|---|---|
| OTA-480 (Radcure Industries) | 15% |
| Igracure 651 (Ciba-Geigy) | 5% |
| Modified Linseed Oil 73-7319 (Cargill, Inc.) | 20% |

EXHIBIT 18

| Ebecryl 657 (Radcure Industries) | 60% |
|---|---|
| OTA-480 (Radcure Industries) | 15% |
| Darocur 1173 (Ciba-Geigy) | 5% |
| Modified Linseed Oil 73-7319 (Cargill, Inc.) | 20% |

EXAMPLE 19

| Ebecryl 657 (Radcure Industries) | 60% |
|---|---|
| OTA-480 (Radcure Industries) | 15% |
| Igracure 184 (Ciba-Geigy) | 5% |
| Modified Linseed Oil 73-7319 (Cargill, Inc.) | 20% |

The test of Example 20 was conducted using the process color inks of Examples 1–4 which were printed using UV rotary letterpress equipment. The press was a Gallus R-250 rotary letterpress set up to print labels. The stock used was 60#Krome Kote label stock from Green Bay Packaging. The cure system was a UVT lamp system produced by UVT incorporated. The lamp system was set at 350 watts per inch at 14 amps and 450 volt supply.

The press was run at 18 meters per minute and good print quality and densities were obtained for all inks. Upon completion of printing, the plate and inking rollers were cleaned using a wash solution composed of sodium metasilicate, sodium hydroxide and Mazawatt 77 (2%) at a pH of 12.8. The clean-up was of the same quality as compared to conventional ink and solvent based blanket and roller wash.

Example 21 demonstrates the applicability of the present invention to a lithographic label manufacturing process.

The ink composition was as follows:

| Ebecryl 657 (Radcure) | 45% |
|---|---|
| OTA-480 (Radcure) | 15% |
| Modified Linseed Oil 73-7319 (Cargill) | 20% |
| Daracure 1130 (Ciba-Geigy) | 2.5% |
| Igracure 369 (Ciba-Geigy) | 2.5% |
| Carbon Black-Regal 400R (Cabot) | 15% |

The press was a Ryobi model 3202 MCS using a conventional integrated dampener and Onyx plate material (3M Company). The fountain solution was Onyx concentrate from 3M Company (6 ounces), Starfount HT-100 from Kelstar Enterprises (6 ounces) and deionized water (116 ounces). The UV curing system was Prime UV model 120/34 manufactured by Prime Systems Inc. The unit was set at power level 4. The test consisted of printing Arabesque label stock at a press speed of 6000 impressions per hour. Immediately after printing, the labels were cured at press speeds, slit and rewound in roll form.

Acceptable print densities were obtained at an ink film of 0.4 mil. After curing, no offset was evident when finishing labels were unrolled and examined visually. Good print quality was obtained and acceptable blanket and roller washups were obtained using water adjusted to pH 13 using caustic soda.

Although the description of the preferred composition and method have been quite specific, it is contemplated that various modifications could be made without deviating from the spirit of the present invention. Accordingly, it is intended that the scope of the present invention be dictated by the appended claims rather than by the description of the preferred composition and methods.

I claim:

1. A substantially water insoluble vehicle for a radiation curable ink composition comprising a substantially unneutralized water reducible resin which is water insoluble at an acidic pH and water washable at an alkaline pH having sufficient basic strength to convert said water reducible resin to a water washable form, said water reducible resin being present in an amount sufficient to cause said vehicle to be water washable at said alkaline pH.

2. The vehicle of claim 1 wherein said water reducible resin is present in an amount of at least about 5% by weight.

3. The vehicle of claim 2 wherein said water reducible resin is present in an amount of about 5% to 50% by weight.

4. The vehicle of claim 1 wherein said water reducible resin is one or more of a water reducible alkyd, a water reducible polyester, a water reducible polyolefin, a water reducible modified oil and a water reducible epoxy ester.

5. The vehicle of claim 4 wherein said water reducible resin is a water reducible alkyd.

6. The vehicle of claim 1 wherein said ink composition is a lithographic ink composition and the Acid Number of said water reducible resin is about 25 to 200.

7. The vehicle of claim 1 including one or more polymerizable pre-polymers wherein said water reducible resin is compatible with said pre-polymers at said acidic pH.

8. The vehicle of claim 7 wherein said pre-polymers comprise one or more oligomers and monomers.

9. A substantially water insoluble radiation curable ink composition comprising a pigment and a vehicle including one or more polymerizable pre-polymers and a water reducible resin compatible with said pre-polymers, said water reducible resin being present in an amount of about 5% to 50% by weight of said vehicle.

10. The ink composition of claim 9 being a lithographic ink composition wherein the Acid Number of said water reducible resin is about 25 to 200.

11. The ink composition of claim 9 wherein said water reducible resin is substantially unneutralized.

12. In a method of making a vehicle for a substantially water insoluble radiation curable ink composition wherein said vehicle includes one or more polymerizable pre-polymers, the improvement comprising combining with said vehicle a substantially unneutralized water reducible resin compatible with said pre-polymers and being present in an amount sufficient to enable said ink composition to be cleaned up using an alkaline wash, but no less than about 5% and no more than about 50% by weight of said vehicle.

13. The method of claim 12 wherein said ink composition is a lithographic ink composition and the Acid Number of said water reducible resin is about 25 to 200.

14. A method of printing a radiation curable ink composition wherein said ink composition is substantially water insoluble and includes a water reducible resin component which is substantially water insoluble at an acidic pH and water washable at an alkaline pH and wherein said water reducible resin component is present in said ink composition in its substantially water insoluble from and in an amount sufficient to enable said ink composition to be cleaned up using an aqueous wash having an alkaline pH, said method comprising:

applying said ink composition to print application equipment;

transferring a portion of said ink composition from said print application equipment to a print receiving substrate; and washing said print application equipment with an alkaline wash solution having an alkaline pH.

15. The method of claim 14 wherein said ink composition is a lithographic ink composition and said method includes applying said ink composition to a lithographic printing plate together with a fountain solution having an acidic pH.

16. The method of claim 15 wherein said water reducible resin has an Acid Number of about 25 to 200.

17. The vehicle of claim 1 wherein said ink composition is a lithographic ink composition.

18. The ink composition of claim 9 being a lithographic ink composition.

19. The method of claim 12 wherein said ink composition is a lithographic ink composition.

20. The method of claim 14 wherein said ink composition is a lithographic ink composition.

* * * * *